United States Patent
Yoo

(10) Patent No.: US 6,790,475 B2
(45) Date of Patent: Sep. 14, 2004

(54) SOURCE GAS DELIVERY

(75) Inventor: Woo Sik Yoo, Palo Alto, CA (US)

(73) Assignee: Wafermasters Inc., San Jose, CA (US)

(*) Notice: Subject to any disclaimer, the term of this patent is extended or adjusted under 35 U.S.C. 154(b) by 96 days.

(21) Appl. No.: 10/120,056

(22) Filed: Apr. 9, 2002

(65) Prior Publication Data

US 2003/0190422 A1 Oct. 9, 2003

(51) Int. Cl.$^7$ ............................................. C23C 16/448
(52) U.S. Cl. ................................. 427/248.1; 427/255.38
(58) Field of Search .......................... 427/248.1, 255.38

(56) References Cited

U.S. PATENT DOCUMENTS

| | | | |
|---|---|---|---|
| 5,595,603 A | 1/1997 | Klinedinst et al. | 118/715 |
| 5,711,816 A | 1/1998 | Kirlin et al. | 118/726 |
| 6,136,725 A | 10/2000 | Loan et al. | 438/758 |
| 6,211,081 B1 * | 4/2001 | Mikata | 438/680 |
| 6,245,151 B1 | 6/2001 | Bhandari et al. | 118/726 |
| 6,251,761 B1 | 6/2001 | Rodder et al. | 438/591 |
| 6,296,711 B1 | 10/2001 | Loan et al. | 118/726 |

FOREIGN PATENT DOCUMENTS

| | | | |
|---|---|---|---|
| EP | 0 196170 | 10/1986 | |
| EP | 0 390127 | 10/1990 | |
| EP | 0 548944 | 6/1993 | |
| EP | 548944 A1 * | 6/1993 | C23C/16/18 |
| WO | WO99 25895 | 5/1999 | |

OTHER PUBLICATIONS

"Heat Transfer Design of CVD Reactors" Sandia National Laboratories, http://endo.sandia.gov/BB/dakota/cvd.html.

* cited by examiner

Primary Examiner—Timothy Meeks
(74) Attorney, Agent, or Firm—MacPherson Kwok Chen & Heid LLP; David S. Park

(57) ABSTRACT

A method and system are provided for delivering a source gas to a processing chamber. A source gas delivery method includes providing a precursor chamber configured to hold precursor vapor, providing a saturated precursor vapor at a selected pressure within the precursor chamber, and flowing or diffusing saturated precursor vapor from the precursor chamber to the processing chamber until a selected pressure is provided in the processing chamber. A source gas delivery system includes a precursor chamber configured to hold precursor vapor, a heat source for heating a precursor liquid to provide saturated precursor vapor at a selected pressure within the precursor chamber, and a vapor pathway allowing saturated precursor vapor to enter a processing chamber until a selected pressure is provided in the processing chamber. Advantageously, the present invention allows for improved precursor vapor delivery and enhanced control over thin film deposition with less waste of precursor material.

23 Claims, 4 Drawing Sheets

SOURCE GAS DELIVERY

BACKGROUND

1. Field of the Invention

This invention generally relates to semiconductor manufacturing equipment and, more particularly, to the controlled delivery of source gas.

2. Description of Related Art

Advanced thin film materials are increasingly important in the manufacture of microelectronic devices. In contrast to traditional thin films, future thin films require new source materials that have low vapor pressures and that are often near their decomposition temperature when heated to achieve an appropriate vapor pressure. Some of the precursors, having both intrinsically low vapor pressure and low thermal decomposition temperature, are considered the best choices for deposition of films of tantalum oxide, tantalum nitride, titanium nitride, copper, and aluminum. For such applications, it is essential that the film morphology and composition be closely controllable. This in turn requires highly reliable and efficient means and methods for delivery of source reagents to the area of film formation.

In some cases, the delivery of reagents into the reactor in the vapor phase has proven difficult because of problems of premature decomposition or stoichiometry control. Examples include the deposition of tantalum oxide from the liquid precursor tantalum pentaethoxide (TAETO) and the deposition of titanium nitride from bis(dialkylamide) titanium reagents.

A precursor is the source of a vapor to be used in forming a thin film. Additionally, precursors often contain impurities, and the presence of those impurities can cause undesirable thermally activated chemical reactions at the vaporization zone, also resulting in formation of involatile solids and liquids at that location. For example, a variety of precursors, such as TAETO, are water-sensitive and hydrolysis can occur at the heated vaporizer zone forming tantalum oxide particulates that may be incorporated into the growing tantalum oxide film with deleterious effects.

Various source reagent delivery systems have been commonly employed to introduce vapors of source reagents to chemical vapor deposition (CVD) reactors. These include bubbler-based systems, liquid mass flow control systems, and liquid metering by pump systems. The use of CVD reactors is well known for thin film deposition and other thermal process steps required in the manufacture of integrated circuits.

FIG. 1A illustrates a typical bubbler-based delivery system, which includes an enclosed precursor chamber 10 at least partially submerged in the liquid of a heating bath 20. The temperature of the bath may be adjusted to heat or cool precursor chamber 10. In operation, precursor chamber 10 contains a precursor liquid. An inert carrier gas travels to precursor chamber 10 along a first pipe 30. The open end of first pipe 30 is located in the precursor liquid. The carrier gas exits the pipe and bubbles to the surface of the precursor liquid. Contained within precursor chamber 10 above the surface of the precursor liquid is a space 40. An input end for a second pipe 50 is located in space 40 above the surface of the precursor liquid. As the stream of the inert gas passes through the liquid precursor and bubbles to the liquid surface, precursor vapor attains its equilibrium vapor pressure more quickly. A "sparger" (a cap with multiple small perforations) is sometimes added to the end of first pipe 30 to ensure formation of small bubbles and rapid equilibration. The carrier gas and precursor vapor enter second pipe 50 and flow to a processing chamber, where the precursor vapor reacts upon a surface of a heated substrate. The temperature of pipe 50 is controlled by heating elements, such as heating coils 55, surrounding second pipe 50 to keep the precursor vapor from condensing during transport to the processing chamber.

The performance of bubbler-based delivery systems is complicated by the exponential dependence of liquid vapor pressure on temperature. Small changes in temperature can cause large changes in reagent delivery rate, leading to poor process control. Lower temperatures and/or higher flow rates of the bubbled carrier gas tend to lower vapor pressure. Therefore, fluctuations in carrier gas temperature and flow rate can cause the vapor pressure of the precursor liquid to fluctuate. Accordingly, the precursor vapor will not always be saturated, leading to fluctuating concentrations of the source reagent. Further, vapor concentration in the bubbler-based system is a function of carrier gas contact time in the fluid as the carrier gas bubbles to the surface. Thus, vapor concentration fluctuates over time as the level of precursor liquid in the precursor chamber changes with use.

FIG. 1B illustrates another common delivery system using a liquid mass flow controller (LMFC) to measure and control the flow rate of liquid precursor to a vaporizer. An enclosed precursor chamber 10 includes a precursor liquid. An inert gas travels to precursor chamber 10 along a first pipe 30. The open end of the pipe is located above the surface of the precursor liquid. Inert gas exits first pipe 30 and pressurizes the precursor liquid within precursor chamber 10. An input end for second pipe 50 is located in the precursor liquid. When the inert gas enters precursor chamber 10, the space above the precursor liquid becomes pressurized such that the level of the precursor liquid within precursor chamber 10 is lowered. Precursor liquid enters second pipe 50 and is transported to a LMFC 60. The precursor liquid exits LMFC 60 and is transported to a vaporizer 70. The precursor liquid is vaporized and is then typically entrained in a carrier gas which delivers it to the heated substrate. Gas exits the vaporizer through a heated pipe 90. The temperature of the pipe is controlled by heating elements, such as heating coils 95, surrounding the pipe.

Disadvantageously, liquid mass flow controllers present a number of drawbacks. LMFCs are extremely sensitive to particles and dissolved gases in the liquid precursor. LMFCs are also sensitive to variations in the temperature of the liquid precursor. Further, most LMFCs cannot operate at temperatures above 40° C., a temperature below which some precursor liquids, such as TAETO, have high viscosity. Another drawback with LMFC-based systems can be attributed to the "dead volume" (e.g. piping) between the LFMC and the vaporizer. Any amount of liquid that remains in the dead volume can contribute in making an inaccurate delivery of source reagent to the vaporizer. These drawbacks can make volumetric control of the liquid precursor very difficult.

The aforementioned inaccuracies in volumetric control of the liquid precursor cause large inaccuracies in final delivery of the precursor vapor to the processing chamber since a small variation in liquid volume (flow rate) results in a large variation in gas volume (flow rate). Further, LMFC-based systems typically use a gas to assist in the vaporization of the liquid precursor, thereby increasing the probability of generating solid particles and aerosols. Additionally, spatial and temporal temperature variations usually occur in the vaporization zone, leading to inconsistent delivery of source reagents.

Finally, because of the temperature difference between the vaporizer and the pipe leading to the processor, such as pipe 90 in this example, condensation may occur during transport of the precursor vapor, which also contributes to inaccurate delivery of the source reagent.

FIG. 1C illustrates another well-known system using a pump for liquid metering of the precursor liquid to a vaporizer. Pump 80 pulls precursor liquid from precursor chamber 10 to a vaporizer 70. Vapor exits the vaporizer in a heated pipe 90. The temperature of the pipe is controlled by heating elements, such as heating coils 95 surrounding the pipe, to prevent condensation.

Pump-based systems have similar disadvantages as LMFC-based systems. Spatial and temporal temperature variations usually occur in the vaporization zone, leading to inconsistent delivery of source reagents. This system is also extremely sensitive to particles and gas dissolved in the liquid. Further, any dead volume of precursor liquid delivered to the vaporizer will increase inaccurate delivery of source gas. Thus, delivery of precursor vapor to the processing chamber lacks high accuracy in this system since a small error in liquid volume measurement or control leads to a large error in vapor volume. Finally, most pumps cannot tolerate high temperatures (maximum 50° C.), below which some precursor liquids have high viscosity.

Therefore, what is needed is a precursor vapor delivery method and system with control for precise stoichiometry by limiting fluctuations in the concentration of source gas delivered to the processing chamber.

SUMMARY

In accordance with the present invention, a method and a system are provided for the controlled delivery of source gas to a processing chamber. A source gas delivery method includes providing a precursor chamber configured to hold precursor vapor, providing saturated precursor vapor at a selected pressure within the precursor chamber, and flowing saturated precursor vapor from the precursor chamber to a processing chamber until a selected pressure is provided within the processing chamber. Advantageously, the present invention provides and controls precise stoichiometry involved in the process reactions by delivering accurate amounts of precursor vapor to the processing chamber.

In another aspect of the present invention, a source gas delivery method includes providing a precursor chamber configured to hold precursor vapor, providing saturated precursor vapor at a selected pressure within the precursor chamber, and diffusing saturated precursor vapor from the precursor chamber to a processing chamber until a selected pressure is provided within the processing chamber.

In yet another aspect of the present invention, a source gas delivery system includes a precursor chamber configured to hold precursor vapor, a heat source for heating a precursor liquid to provide saturated precursor vapor at a selected pressure within the precursor chamber, and a vapor pathway allowing saturated precursor vapor to enter a processing chamber until a selected pressure is provided in the processing chamber.

In FIG. 4, an advantage of the present invention is illustrated using graph 400, which shows how the concentration of the vapor delivered to a processing chamber can vary over time. In a typical vapor delivery system, precursor vapor is delivered at a fairly constant level 402, with fluctuations in the concentration occurring constantly. This manner of precursor vapor delivery ensures that enough source gas is available during processing operations. Unfortunately, most of the source gas is wasted since only a small percentage is consumed in the processing operation. The wasted gas must be vented, which can also require special procedures and additional treatments.

In the present invention, once a predetermined concentration of vapor 404 is delivered to the process chamber, the delivery is stopped. As the vapor reagents are consumed in the processing, the concentration level 404 drops, but the amount of wasted gas is substantially reduced since the difference between concentration level 402 and concentration level 404 will not have to be purged.

These and other features and advantages of the present invention will be more readily apparent from the detailed description of the embodiments set forth below taken in conjunction with the accompanying drawings.

DETAILED DESCRIPTION

Figure 1A:
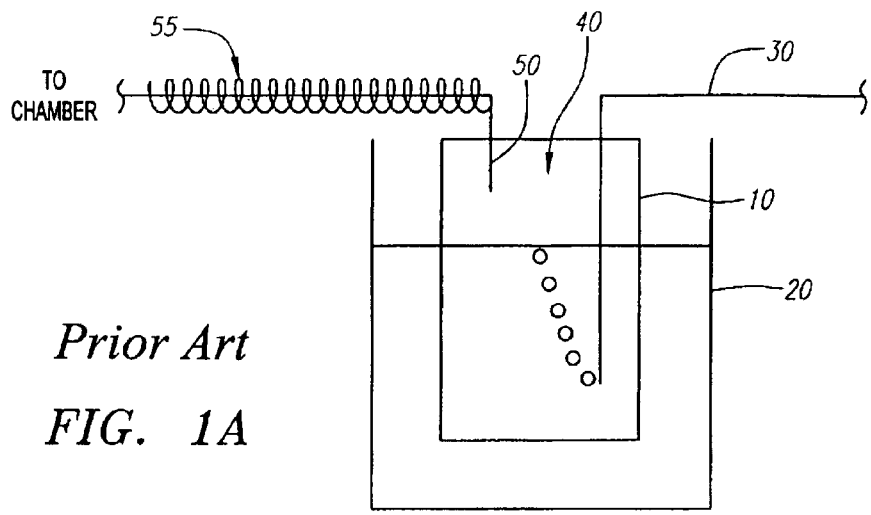
FIG. 1A is a simplified illustration of a bubbler-based delivery system.
Figure 1B:
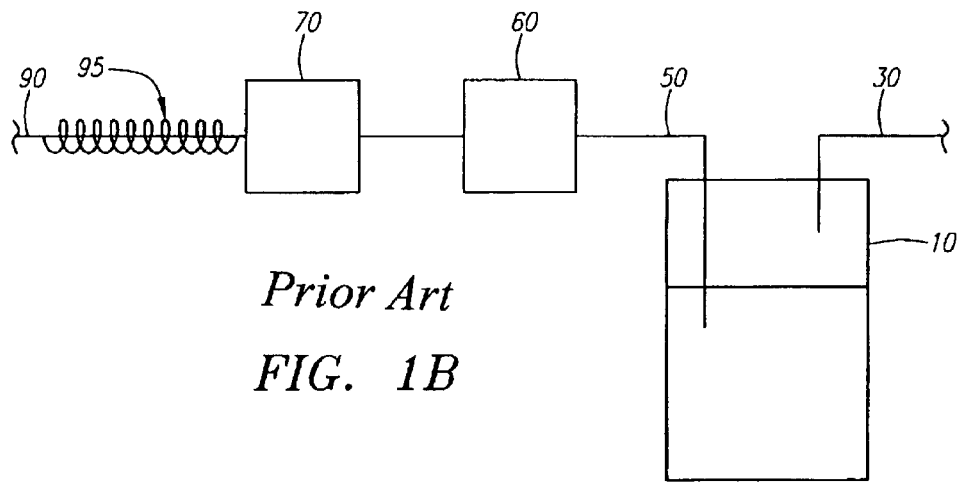
FIG. 1B is a simplified illustration of a liquid mass flow control delivery system.
Figure 1C:
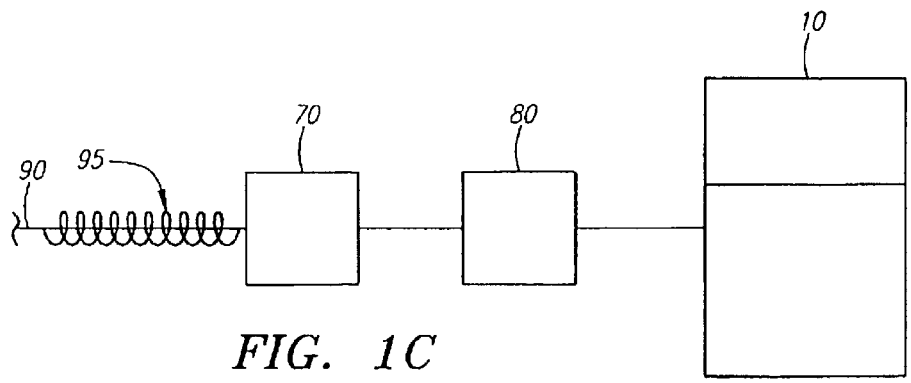
FIG. 1C is a simplified illustration of a liquid metering by pump delivery system.
Figure 2A:
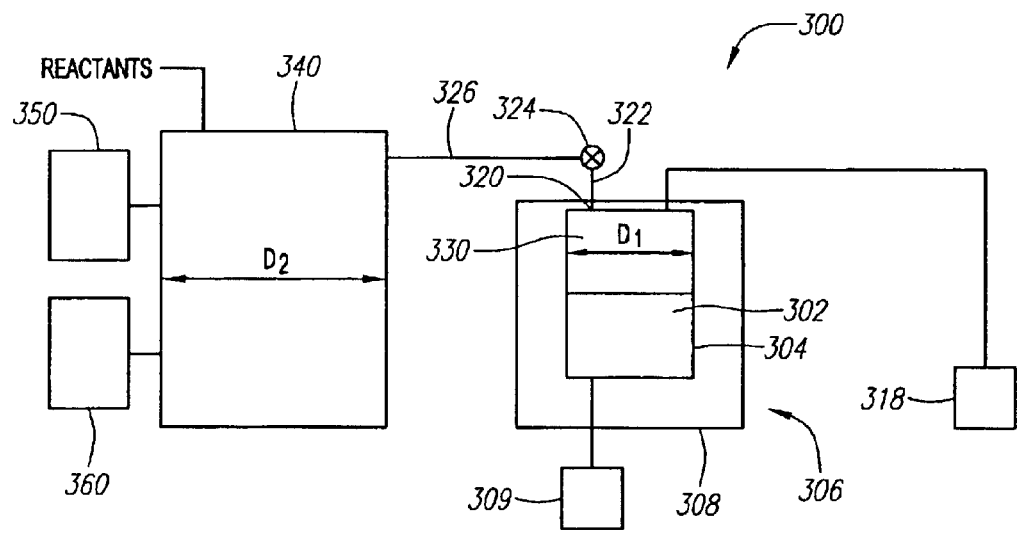
FIG. 2A illustrates a simplified schematic view of a source gas delivery system in accordance with an embodiment of the present invention.

FIG. 2A illustrates source gas delivery system 300 in accordance with an embodiment of the present invention. A precursor liquid 302 is enclosed in a precursor chamber 304. Precursor liquid 302 can include liquid reagents having low vapor pressure at room temperature, such as tantalum pentaethoxide (TAETO), triethylaluminum (TEA), trimethylaluminum (TMA), triethlyphosphorous (TEP), and triethylgallium (TEGa) or any other liquid source, such as $SiCl_4$, $GeCl_4$, HCl and the like. Precursor liquid 302 is not highly volatile but can be heated to form non-negligible precursor vapor.

Precursor chamber 304 is in thermal contact with a heat source 306 to heat precursor liquid 302. Heat source 306 can be any heating apparatus which uniformly heats and controls the temperature of precursor liquid 302, such as a heating bath, heating plate, and convection oven. In the embodiment illustrated in FIG. 2A, a temperature-controlled liquid bath 308 is used to heat precursor chamber 304. Precursor chamber 304 is at least partially submerged in liquid bath 308 to a level where precursor liquid 302 is at least fully submerged in the bath fluid. In an alternative embodiment, precursor chamber 304 is fully submerged in the liquid bath to allow precursor vapor as well as the precursor liquid to be heated. In this illustrative embodiment, the liquid bath is heated to between approximately 50° C. and approximately 220° C.

Bath fluids having low volatility, high boiling points, and/or high heat capacities which can be used in liquid bath 308 are available commercially. Examples of bath fluids, with no intention to limit the invention thereby, are the Silicone series of bath fluids, available from Cole-Parmer Instrument Co., Vernon Hills, Ill.

Precursor chamber 304 includes a control diameter D1. As D1 is made larger, the surface area of exposed precursor liquid 302 is increased. Accordingly, saturated precursor vapor is more quickly formed and made available for delivery to the processing chamber upon heating.

Control diameter D1 also controls for backflow or negative pressure drop during vapor delivery to processing chamber 340, which includes a diameter D2. For example, as control diameter D1 is made larger relative to diameter D2, the pressure drop between precursor chamber 304 and processing chamber 340 becomes negligible, thereby controlling for backflow during vapor delivery. In one embodiment, control diameter D1 is in the range of between approximately 25 mm and approximately 300 mm, and diameter D2 is in the range of between approximately 50 mm and approximately 1000 mm.

Optionally, precursor chamber 304 is operably connected to a precursor source 309. Precursor source 309 may continuously feed precursor liquid to precursor chamber 304 or it may feed discrete amounts of precursor liquid as needed. In the alternative, precursor chamber 304 is a stand-alone batch chamber that is manually refilled with precursor liquid as needed.

The source gas delivery system of the present invention further includes a vapor pathway allowing saturated precursor vapor to enter the processing chamber from the precursor chamber. In one embodiment, the vapor pathway includes a vapor inlet 320 located in a space 330 above the surface of liquid precursor 302 in precursor chamber 304. A first end of pipe 322 is operably connected to vapor inlet 320. A second end of pipe 322 is operably connected to open/close valve 324. A first end of pipe 326 is also operably connected to open/close valve 324, and a second end of pipe 326 is operably connected to processing chamber 340. Valves and seals which can be used in this system are available commercially from Rohm and Haas Company, North Andover, Mass.

Figure 5:
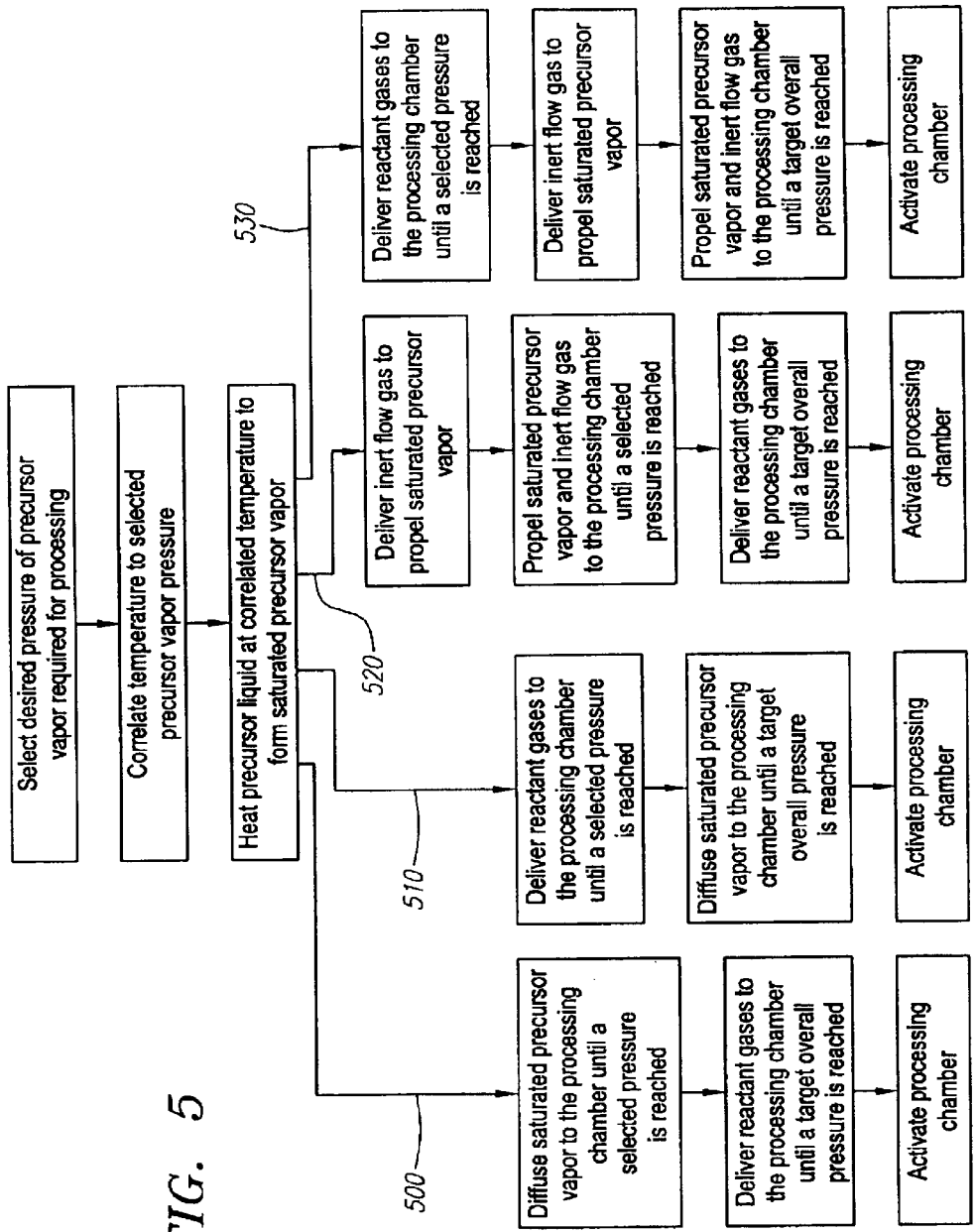
FIG. 5 is a flow chart of several source gas delivery methods in accordance with embodiments of the present invention.

As shown by the flowchart in FIG. 5 in conjunction with system 300 in FIG. 2A, the source gas delivery method of the present invention includes the selection of a desired pressure of precursor vapor required for processing in processing chamber 340. By having accurate control over the concentration of precursor vapor delivered to the processing chamber, improved control over stoichiometry, and therefore film composition, is achieved. The stoichiometry for the reaction involving precursor vapor and reactant gases in processing chamber 340 is determined by controlling the total pressure of processing chamber 340 and by controlling the temperature of heat source 306, which determines the vapor pressure of precursor liquid 302.

Dalton's law of partial pressures states that for a mixture of gases in a container, the total pressure exerted is the sum of the pressures that each gas would exert if it were alone. The pressure that each gas would exert if it were alone in the container is known as the partial pressure of each gas. Mole fraction, $\chi$, of a particular component in a mixture, assuming ideal gases, is directly related to its partial pressure, being defined as partial pressure, Pn, divided by total pressure, Ptotal. Mole percentage of a particular component in a mixture is defined as mole fraction multiplied by 100. Thus, in the present invention, reaction stoichiometry and film composition are accurately controlled based upon the precise mole percentage or partial pressure of precursor vapor delivered to processing chamber 340.

Figure 3:
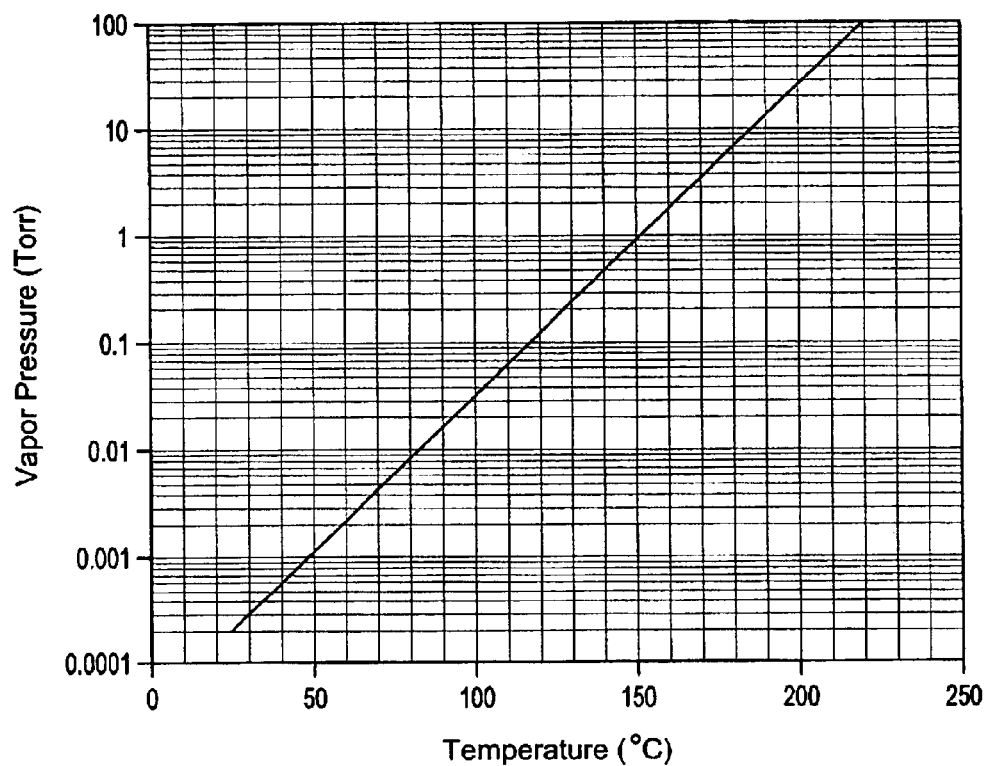
FIG. 3 is a graph of vapor pressure versus temperature for TAETO.
Figure 4:
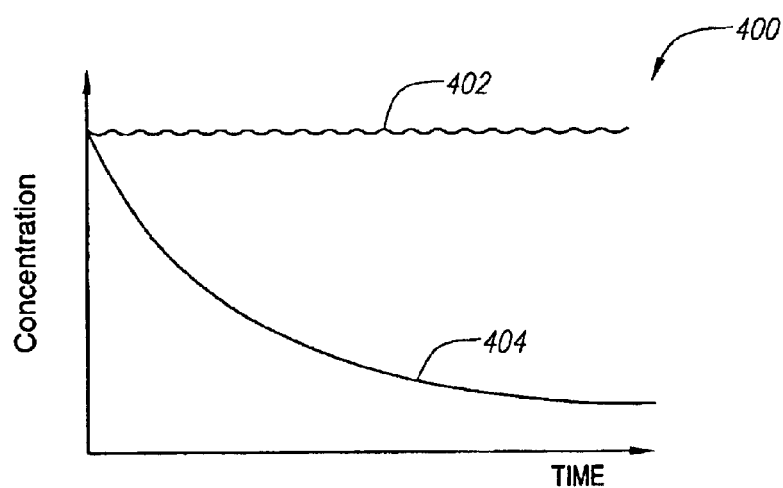
FIG. 4 is a graph of source gas concentration versus time in a processing chamber.

In accordance with the present invention, the selected pressure is the desired precursor vapor partial pressure needed for processing in processing chamber 340. To generate the selected pressure, precursor liquid 302 is subjected to a temperature which correlates to the selected precursor vapor pressure. Thus, another step in the source gas delivery method of the present invention is to correlate a temperature to the selected precursor vapor pressure. The correlations between temperature and vapor pressure for pure substances are well known in the art. For example, FIG. 3 is a graph showing the vapor pressure of TAETO corresponding to temperature. Similar graphs exist for other substances.

Referring again to FIG. 5, a further step in the source gas delivery method of the present invention is to continually heat the precursor liquid at the determined temperature until the precursor liquid/vapor mixture reaches equilibrium. Accordingly, the precursor vapor will be saturated at a vapor pressure equal to the selected pressure. A pressure sensor 318 is optionally used to monitor precursor vapor pressure in precursor chamber 304 (FIG. 2A).

After heating the precursor liquid at the correlated temperature to form saturated precursor vapor, alternative paths may be taken in the source gas delivery method of the present invention, as shown by FIG. 5 in conjunction with FIG. 2A. Processing chamber 340 may be either vacuumed by a vacuum pump 350 or filled with reactant gases to a preselected pressure before receiving the precursor vapor. In one embodiment, as shown by path 500, processing chamber 340 is first under vacuum, and a step in the source gas delivery method is to place open/close valve 324 in the open position to allow saturated precursor vapor to enter pipe 322 by diffusion. Precursor vapor then diffuses through pipe 326 to processing chamber 340. The processing chamber is filled with precursor material and equilibrium is eventually approximated between precursor chamber 304 and processing chamber 340 over time. Once a selected pressure is reached within processing chamber 340, open/close valve 324 is closed to stop precursor vapor from entering processing chamber 340. A pressure sensor 360 is used to determine the overall pressure in the processing chamber. Reactant gases are then delivered to the processing chamber to a target overall pressure, after which the processing chamber is activated to start film formation.

In another embodiment, as shown by path 510 in FIG. 5 in conjunction with FIG. 2A, reactant gases are first loaded into processing chamber 340 to a selected pressure. Open/close valve 324 is opened and precursor vapor is diffused into processing chamber 340 to a target overall pressure. Open/close valve 324 is then closed and the processing chamber is activated to start film formation.

Generally, no more precursor material is required during processing in the processing chamber once the target overall pressure is achieved. Advantageously, this method prevents precursor material from having to be vented after the processing and thus saves precursor material. Since no carrier gas is used in this embodiment, fluctuations in precursor vapor concentration associated with carrier gas use are eliminated. Further, since no bubbling takes place, the precursor vapor concentration does not fluctuate with changing levels of precursor liquid. Another advantage of the present invention is that any impurities or decomposed products from the precursor liquid are left in the precursor chamber since only the precursor vapor is delivered to the processing chamber. Additionally, no heating elements are necessary to heat the vapor pathway from the precursor chamber to the processing chamber because, unlike vaporizer systems, the temperature difference between the precursor chamber and the vapor pathway is minimal. In addition, the vapor pathway can be made with a large enough diameter to increase the throughput of the precursor vapor while minimizing the possibility of condensation.

Figure 2B:
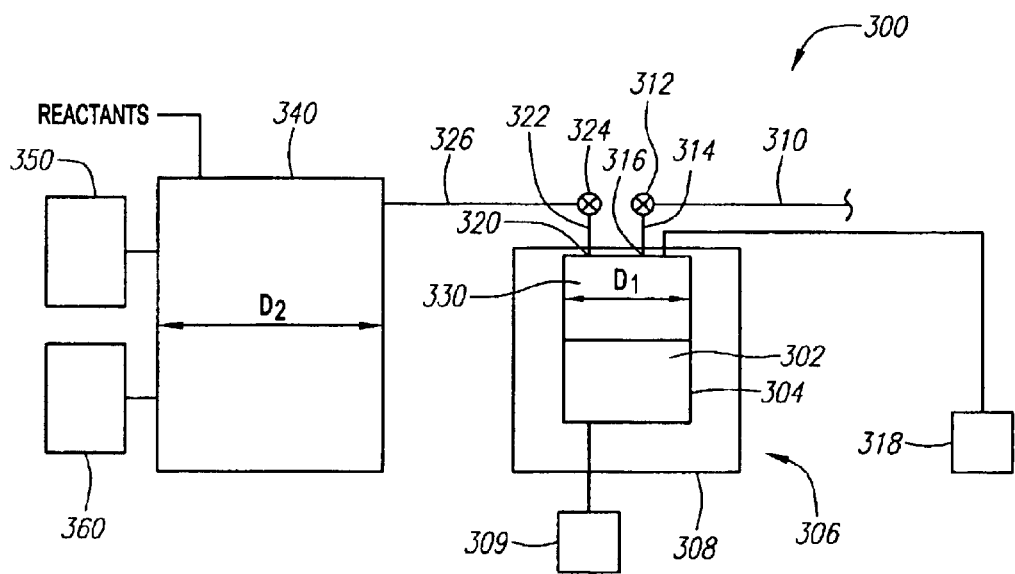
FIG. 2B illustrates another simplified schematic view of a source gas delivery system in accordance with an embodiment of the present invention.

In an alternative embodiment, as shown by path 520 in FIG. 5 in conjunction with FIG. 2B, flow gas may travel along a first pipe 310 to an open/close valve 312. An open end 316 of pipe 314 is located in a space 330 above the precursor liquid in precursor chamber 304. If open/close valve 312 is in the open position, flow gas enters pipe 314 and exits at open end 316 into space 330. Space 330 is initially under vacuum and only precursor vapor will occupy space 330 as the precursor liquid is heated. Once precursor vapor saturation has been reached, open/close valves 312 and 324 are opened and the flow gas is used to directly propel the saturated precursor vapor to the processing chamber, without bubbling, until a target overall pressure is reached. Inert flow gases, such as Ar, He, $O_2$, and $N_2$, may be delivered to precursor chamber 304 at flowrates of between approximately 100 cc/min to approximately 10,000 cc/min, to propel the saturated precursor vapor. Further, the flow gas may be metered in this embodiment to determine the partial pressure contribution of the flow gas in order to compensate for an increase in the overall pressure within the processing chamber. Flow gas effects on vapor concentration are negligible, since no bubbling occurs and the flow gas is used to only add kinetic energy to the saturated precursor vapor for delivery to processing chamber 340. Once the target overall pressure is reached, the processing chamber is activated to start film formation.

In another embodiment, as shown by path 530 in FIG. 5 in conjunction with FIG. 2B, reactant gases are first loaded into processing chamber 340 to a selected pressure. Then open/close valves 312 and 324 are opened and inert flow gas is used to propel the saturated precursor vapor to the processing chamber until a target overall pressure is reached, after which the processing chamber is activated to start film formation.

In accordance with one embodiment of the present invention, precursor liquid TAETO is heated between approximately 50° C. to approximately 220° C., achieving saturated vapor pressures of between approximately 0.001 Torr (~0.13 Pa) to approximately 100 Torr (~13 kPa), respectively. The processing chamber is targeted to achieve an overall pressure ranging between approximately 0.001 Torr (~0.13 Pa) to approximately 760 Torr (~1 MPa). The saturated precursor vapor has a mole percentage in the processing chamber ranging from approximately 0.1% to approximately 50%. A layer of tantalum oxide ($Ta_2O_5$) may be grown to thicknesses ranging between approximately 50 Å to approximately 500 Å.

In one example, precursor liquid TAETO is heated to 130° C. to achieve a saturated vapor pressure of 0.2 Torr (~26 Pa) (FIG. 3). The precursor vapor is delivered to the processing chamber to a pressure of 0.2 Torr (~26 Pa) followed by delivery of reactant gases to an overall target pressure of 1 Torr (~133 Pa). In an alternative example, reactant gases are delivered to the processing chamber to a pressure of 0.8 Torr (~106 Pa) followed by the precursor vapor to an overall target pressure of 1 Torr (~133 Pa). The mixture of 20% mole percentage of precursor vapor is reacted in the processing chamber at 450° C. for 10 minutes to grow about 100 Å of tantalum oxide.

In another example, precursor liquid TAETO is heated to 200° C. to achieve a saturated vapor pressure of 20 Torr (~2.6 kPa). The precursor vapor is delivered to the processing chamber to a pressure of 20 Torr (~2.6 kPa) followed by delivery of reactant gases to an overall target pressure of 100 Torr (~13 kPa). Alternatively, reactant gases are delivered to the processing chamber to a pressure of 80 Torr (10.6 kPa) followed by the precursor vapor to an overall target pressure of 100 Torr (~13 kPa). This mixture of 20% mole percentage of precursor vapor is reacted in the processing chamber at 450° C. for 2 minutes to grow about 100 Å of tantalum oxide.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as falling within the true spirit and scope of this invention.

What is claimed is:

1. A source gas delivery method, comprising:

providing a precursor chamber configured to hold precursor vapor;

providing saturated precursor vapor at a selected pressure within the precursor chamber;

delivering a flow gas to the precursor chamber thereby contributing a flow gas partial pressure; and flowing saturated precursor vapor from the precursor chamber to a processing chamber until a target pressure is provided within the processing chamber, the target pressure corresponding to a sum of the selected pressure and the flow gas partial pressure.

2. The method of claim 1, wherein the precursor chamber is configured to hold a precursor liquid.

3. The method of claim 2, wherein the precursor liquid is held in the precursor chamber while being heated.

4. The method of claim 2, wherein the precursor liquid is taken from the group consisting of tantalum pentaethoxide (TAETO), triethylaluminum (TEA), trimethylaluminum (TMA), triethylphosphorous (TEP), triethylgallium (TEGa), $SiCl_4$, $GeCl_4$, and HCl.

5. The method of claim 2, wherein the precursor liquid is heated to a selected temperature ranging from approximately 50° C. to approximately 220° C.

6. The method of claim 1, wherein the precursor chamber is a batch precursor chamber.

7. The method of claim 1, wherein the precursor chamber is operably coupled to a precursor liquid source.

8. The method of claim 1, further comprising:

heating a precursor liquid using a temperature-controlled heating bath.

9. The method of claim 1, wherein the saturated precursor vapor has a pressure ranging from approximately 0.001 Torr to approximately 100 Torr.

10. The method of claim 1, wherein the saturated precursor vapor has a mole percentage in the processing chamber ranging from approximately 0.1% to approximately 50%.

11. The method of claim 1, further comprising:

delivering a flow gas to a space in the precursor chamber including saturated precursor vapor.

12. The method of claim 1, further comprising providing a reactant gas at a reactant gas partial pressure in the processing chamber after flowing saturated precursor vapor from the precursor chamber to the processing chamber.

13. A source gas delivery method, comprising:
   providing a precursor chamber configured to hold precursor vapor;
   providing saturated precursor vapor at a selected pressure within the precursor chamber; and
   diffusing saturated precursor vapor from the precursor chamber to a processing chamber until the selected pressure is provided within the processing chamber, the selected pressure corresponding to a desired precursor vapor partial pressure in the processing chamber.

14. The method of claim 13, wherein the precursor chamber is configured to hold a precursor liquid.

15. The method of claim 14, wherein the precursor liquid is taken from the group consisting tantalum pentaethoxide (TAETO), triethylaluminum (TEA), trimethylaluminum (TMA), triethlyphosphorous (TEP), triethylgallium (TEGa), $SiCl_4$, $GeCl_4$, and HCl.

16. The method of claim 14, wherein the precursor liquid is heated to a selected temperature ranging from approximately 50° C. to approximately 220° C.

17. The method of claim 13, wherein the providing saturated precursor vapor at a selected pressure comprises heating a precursor liquid using a temperature-controlled heating bath.

18. The method of claim 13, wherein the saturated precursor vapor has a pressure ranging from approximately 0.001 Torr to approximately 100 Torr.

19. The method of claim 13, wherein the saturated precursor vapor has a mole percentage in the processing chamber ranging from approximately 0.1% to approximately 50%.

20. The method of claim 13, wherein saturated precursor vapor is diffused to the processing chamber until equilibrium is approximated between the precursor chamber and the processing chamber.

21. The method of claim 13, further comprising providing a reactant gas at a reactant gas partial pressure in the processing chamber after diffusing saturated precursor vapor from the precursor chamber to the processing chamber.

22. A source gas delivery method, comprising:
   providing a precursor chamber configured to hold precursor vapor;
   providing a processing chamber operably coupled to the precursor chamber;
   providing saturated precursor vapor at a selected pressure within the precursor chamber;
   delivering a flow gas to the precursor chamber thereby contributing a flow gas partial pressure;
   providing a reactant gas at a reactant gas pressure within the processing chamber; and
   flowing saturated precursor vapor from the precursor chamber to the processing chamber until a target pressure is provided within the processing chamber, the target pressure corresponding to a sum of the selected pressure, the flow gas partial pressure, and the reactant gas pressure.

23. A source gas delivery method, comprising:
   providing a precursor chamber configured to hold precursor vapor;
   providing a processing chamber operably coupled to the precursor chamber;
   providing saturated precursor vapor at a selected pressure within the precursor chamber;
   providing a reactant gas at a reactant gas pressure within the processing chamber; and
   diffusing saturated precursor vapor from the precursor chamber to the processing chamber until a target pressure is provided within the processing chamber, the target pressure corresponding to a sum of the selected pressure within the precursor chamber and the reactant gas pressure.

* * * * *